(12) United States Patent
Kojima

(10) Patent No.: US 6,449,201 B1
(45) Date of Patent: Sep. 10, 2002

(54) SEMICONDUCTOR MEMORY DEVICE HAVING A HIERARCHICAL BIT LINE ARCHITECTURE

(75) Inventor: Makoto Kojima, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/913,010

(22) PCT Filed: Dec. 7, 2000

(86) PCT No.: PCT/JP00/08685
§ 371 (c)(1),
(2), (4) Date: Oct. 3, 2001

(87) PCT Pub. No.: WO01/43140
PCT Pub. Date: Jun. 14, 2001

(30) Foreign Application Priority Data

Dec. 8, 1999 (JP) .......................... 11-349301

(51) Int. Cl.[7] ................................. G11C 7/00
(52) U.S. Cl. .................. 365/205; 365/185.25; 365/203
(58) Field of Search ............... 365/205, 203, 365/185.25

(56) References Cited

U.S. PATENT DOCUMENTS 5,969,990 A * 10/1999 Arase .................... 365/185.17
5,976,929 A * 11/1999 Kajigaya et al. ............ 438/241

FOREIGN PATENT DOCUMENTS

| EP | 0 530 713 A2 | 3/1993 |
|----|--------------|--------|
| JP | 2-7293 | 1/1990 |
| JP | 9-219095 | 8/1997 |

* cited by examiner

Primary Examiner—David Nelms
Assistant Examiner—Tu-Tu Ho
(74) Attorney, Agent, or Firm—Michael K. Kelly; Snell & Wilmer, LLP

(57) ABSTRACT

A semiconductor memory device 100 includes: a differential sense amplifier 9 having an input node 9a and an input node 9b, an information read section 110a, a reference section 110b, and a control section 140. The information read section 110a includes: a main bit line MBL coupled to the input node 9a; a select gate 4a; a sub-bit line SBL which is coupled to the main bit line MBL via the select gate 4a; a memory cell 1 which is coupled to the sub-bit line SBL and which is selectively activated in accordance with a voltage on a word line WL: a precharge section 120a for precharging the input node 9a and the main bit line MBL to a supply voltage $V_{dd}$; and a reset section 130b for resetting the sub-bit line SBL to a ground voltage $V_{ss}$. The control section 140 controls the precharge section 120a, the reset section 130a, and the select gate 4a so that a portion of a charge which is precharged in the input node 9a and the main bit line MBL is redistributed to the sub-bit line SBL after precharging the input node 9a and the main bit line MBL to the supply voltage $V_{dd}$ and resetting the sub-bit line SBL to the ground voltage $V_{ss}$.

11 Claims, 6 Drawing Sheets

FIG. 3
① Initial state
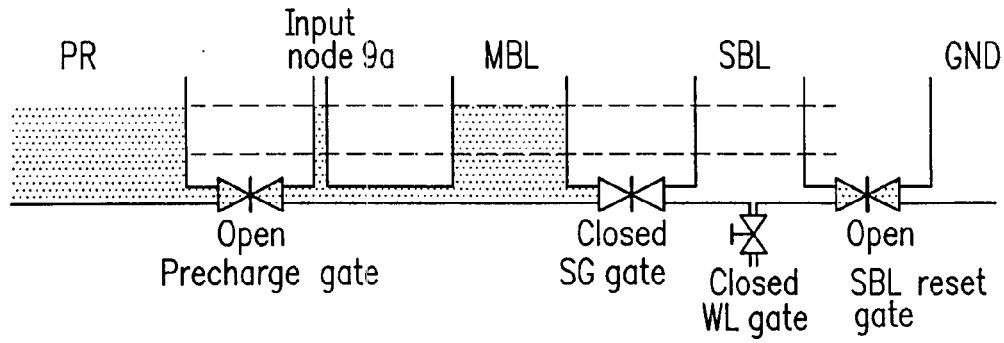
② Charge redistribution and start of integration period
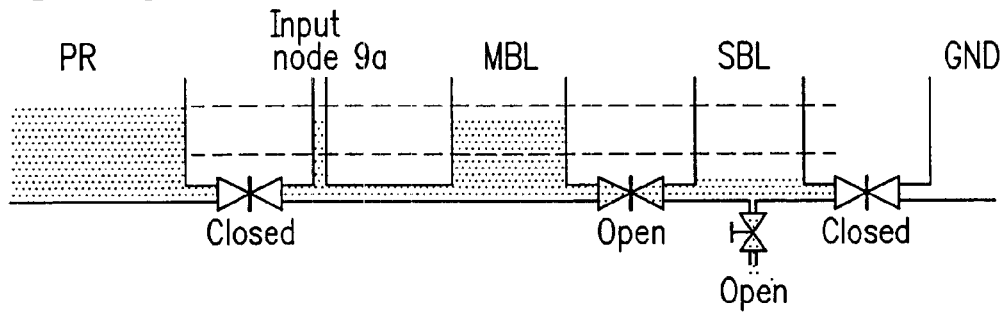
③ Integration period
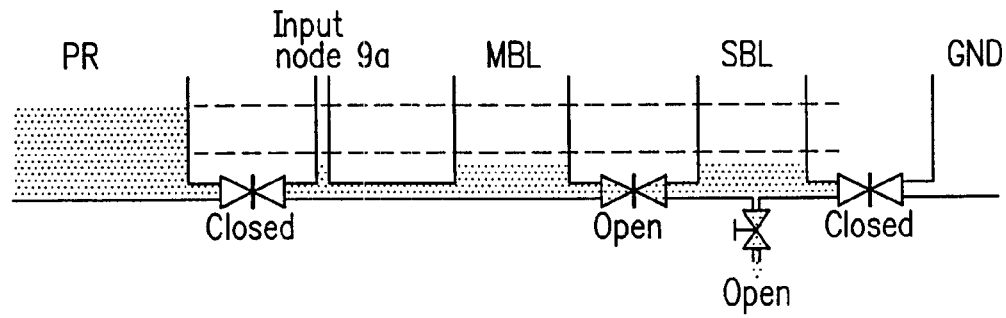

FIG. 4
① Initial state
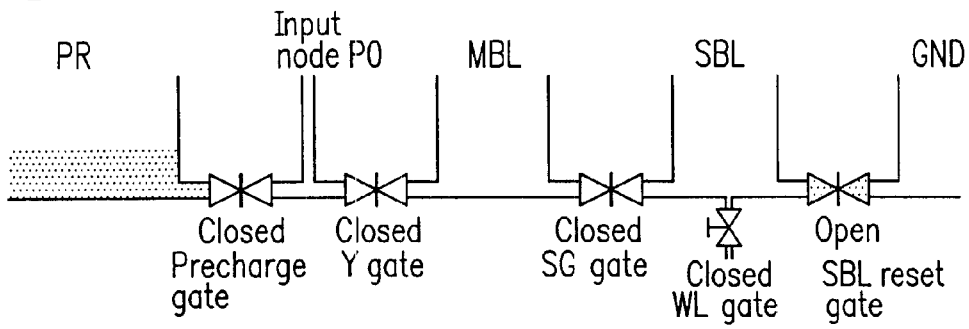
② Start of precharge
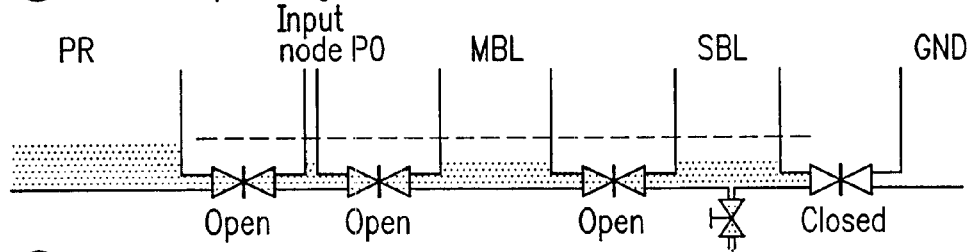
③ Completion of precharge
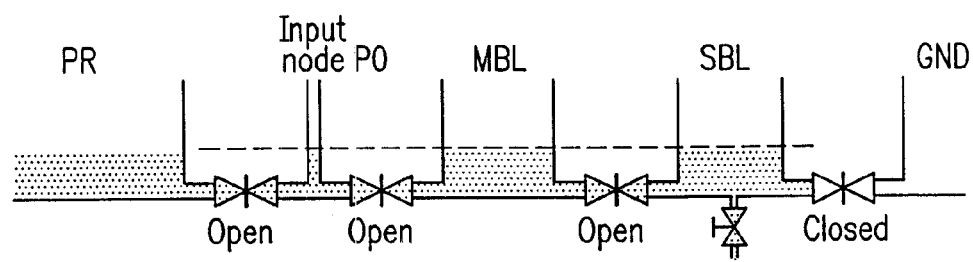
④ Start of integration period
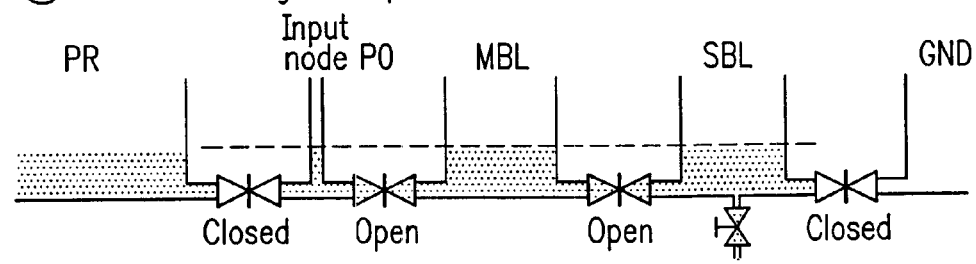
⑤ Integration period
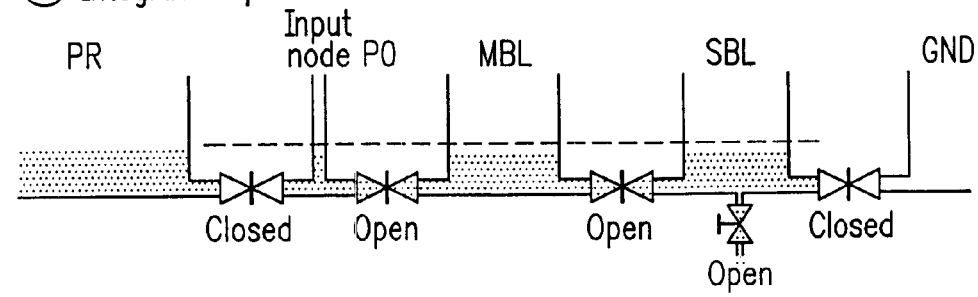

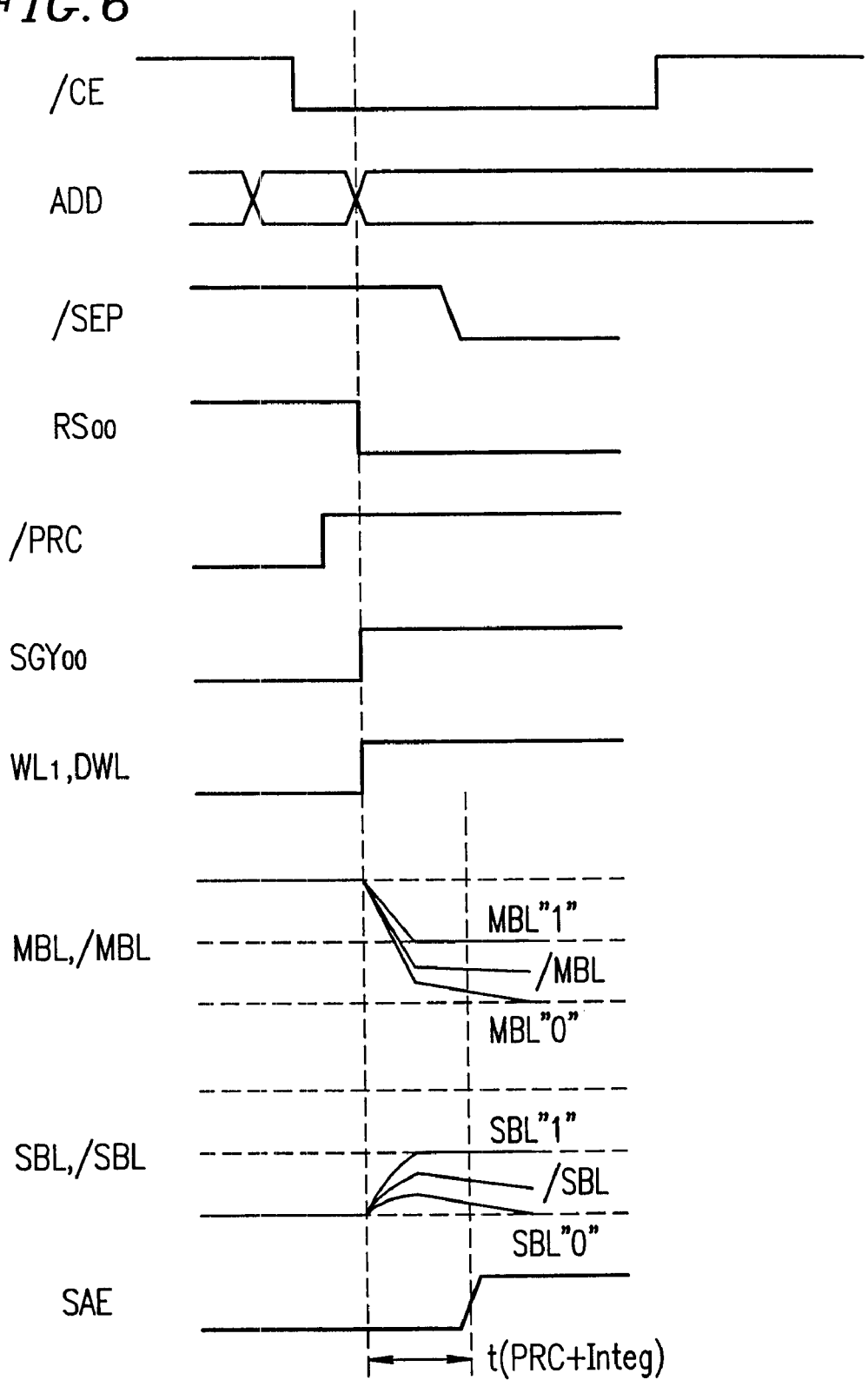

SEMICONDUCTOR MEMORY DEVICE HAVING A HIERARCHICAL BIT LINE ARCHITECTURE

TECHNICAL FIELD

The present invention relates to a semiconductor memory device, and in particular to a semiconductor memory device which allows information to be read from a memory cell with a high speed.

BACKGROUND ART

In recent years, there has been a desire for fast microcomputers having an operation speed of over 100 MHz. As microcomputers become faster in operation, the operation of ROMs and flash memories which are mounted on the same chip as the microcomputers are also required to become faster. Such ROMs and flash memories are usually mounted on a chip for the purpose of customizing the chip.

The required memory capacity is also on the increase with recent enhancements in the functions of microcomputers.

Against such a background, vigorous research and development activities are being made to realize large capacity semiconductor memory devices which are capable of fast read operations. For example, a semiconductor memory device based on a hierarchical bit line method has been proposed.

M. Hiraki et al. (ISSCC Digest of Technical Papers, pp. 116–117, 453, February 1999) discloses a semiconductor memory device based on a hierarchical bit line method.

However, in accordance with the aforementioned type of semiconductor memory device, it is necessary to perform an integration operation for sensing a difference between the voltage on the main bit line and the voltage on a complementary main bit line after completing precharging of the main bit line and a sub-bit line. Therefore, in order to read information from a memory cell, a period of time (tPRC+tInteg) is required, which is a sum of the time required for precharging the main bit line and the sub-bit line (i.e., tPRC) and the time required for sensing the voltage difference (i.e., tInteg). This has presented difficulties in the realization of a fast read operation of information from memory cells.

Thus, in view of the aforementioned problems, the present invention aims to provide a semiconductor memory device which is capable of reading information from memory cells with a high speed.

DISCLOSURE OF THE INVENTION

A semiconductor memory device according to the present invention comprises: a differential sense amplifier having a first input node and a second input node for sensing a difference between a voltage on the first input node and a voltage on the second input node; an information read section for supplying a voltage varying in accordance with information which is read from a memory cell, the voltage being supplied to the first input node; a reference section for supplying a reference voltage to the second input node; and a control section for controlling the differential sense amplifier, the information read section, and the reference section, wherein the information read section includes: a main bit line coupled to the first input node; a select gate; a sub-bit line which is coupled to the main bit line via the select gate; a memory cell which is coupled to the sub-bit line and which is selectively activated in accordance with a voltage on a word line; a precharge section for precharging the first input node and the main bit line to a first voltage; and a reset section for resetting the sub-bit line to a second voltage which is lower than the first voltage, wherein the control section controls the precharge section, the reset section, and the select gate so that a portion of a charge which is precharged in the first input node and the main bit line is redistributed to the sub-bit line after precharging the first input node and the main bit line to the first voltage and resetting the sub-bit line to the second voltage. As a result, the aforementioned objective is accomplished.

The information read section may further comprise: a first capacitance coupled to the main bit line; and a second capacitance coupled to the sub-bit line.

A voltage on the sub-bit line after the charge which is precharged in the first input node and the main bit line is redistributed may be equal to or less than about 1 V.

The reference section may comprise: a complementary main bit line coupled to the second input node: and a precharge section for precharging the second input node and the complementary main bit line to a third voltage, wherein the third voltage is equal to a voltage which is obtained by multiplying the first voltage by a predetermined ratio.

The reference section may output the reference voltage by using a reference cell having a current performance which is substantially half of a current performance of the memory cell.

The differential sense amplifier may sense the difference between the voltage on the first input node and the voltage on the second input node through sense integration.

The sense integration may be begun while a portion of a charge which is precharged in the first input node and the main bit line is redistributed to the sub-bit line.

Another semiconductor memory device according to the present invention comprises: a differential sense amplifier having a first input node and a second input node for sensing a difference between a voltage on the first input node and a voltage on the second input node; a main bit line coupled to the first input node; a complementary main bit line coupled to the second input node; a precharge section for precharging the main bit line and the complementary main bit line to a first voltage; a plurality of subarrays arranged in a direction along which the main bit line and the complementary main bit line extend; and a control section for controlling the differential sense amplifier, the precharge section, and the plurality of subarrays, wherein each of the plurality of subarrays includes: a select gate section for selectively coupling the main bit line to one of a plurality of sub-bit lines and selectively coupling the complementary main bit line to one of a plurality of complementary sub-bit lines; a reset section for resetting the plurality of sub-bit lines to a second voltage which is lower than the first voltage, selectively releasing the resetting of one of the plurality of sub-bit lines, resetting the plurality of complementary sub-bit lines to the second voltage, and selectively releasing the resetting of one of the plurality of complementary sub-bit lines; a memory cell array including a plurality of memory cells; and a reference cell array including a plurality of reference cells, wherein: each of the plurality of memory cells is selectively activated in accordance with a voltage on a corresponding one of a plurality of word lines, and each of the plurality of reference cells is selectively activated in accordance with a voltage on a reference word line; at least one of the plurality of memory cells and at least one of the plurality of reference cells are coupled to each of the plurality of sub-bit lines; at least one of the plurality of memory cells and at least one of the plurality of reference cells are coupled to each of the plurality of complementary sub-bit lines; and the control section controls the precharge section and the plurality of subarrays so that a portion of a charge which is precharged in the main bit line is redistributed to the sub-bit line which has been released from resetting, and that a portion of a charge which is precharged in the complementary main bit line is redistributed to the complementary sub-bit line which has been released from resetting after precharging the main bit line and the complementary main bit line to the first voltage and previously resetting the plurality of sub-bit lines and the plurality of complementary sub-bit lines to the second voltage, and selectively releasing the resetting of one of the plurality of sub-bit lines and one of the plurality of complementary sub-bit lines. As a result, the aforementioned objective is accomplished.

The control section may control the plurality of subarrays so as to maintain a reset state of at least one sub-bit line adjoining the sub-bit line to which the charge has been redistributed from the main bit line, and to maintain a reset state of at least one complementary sub-bit line adjoining the complementary sub-bit line to which the charge has been redistributed from the complementary main bit line.

Another semiconductor memory device according to the present invention comprises: a differential sense amplifier having a first input node and a second input node for sensing a difference between a voltage on the first input node and a voltage on the second input node; a main bit line coupled to the first input node; a complementary main bit line coupled to the second input node; a precharge section for precharging the main bit line and the complementary main bit line to a first voltage; a plurality of subarrays arranged in a direction along which the main bit line and the complementary main bit line extend; and a control section for controlling the differential sense amplifier, the precharge section, and the plurality of subarrays, wherein each of the plurality of subarrays includes: a select gate section for selectively coupling the main bit line to one of a plurality of sub-bit lines and selectively coupling the complementary main bit line to one of a plurality of complementary sub-bit lines; a reset section for resetting the plurality of sub-bit lines to a second voltage which is lower than the first voltage, selectively releasing the resetting of one of the plurality of sub-bit lines, resetting the plurality of complementary sub-bit lines to the second voltage, and selectively releasing the resetting of one of the plurality of complementary sub-bit lines; and a memory cell array including a plurality of memory cells, wherein: each of the plurality of memory cells is selectively activated in accordance with a voltage on a corresponding one of a plurality of word lines; at least one of the plurality of memory cells is coupled to each of the plurality of sub-bit lines; at least one of the plurality of memory cells is coupled to each of the plurality of complementary sub-bit lines; and the control section controls the precharge section and the plurality of subarrays so that a portion of a charge which is precharged in the main bit line is redistributed to the sub-bit line which has been released from resetting, and that a portion of a charge which is precharged in the complementary main bit line is redistributed to the complementary sub-bit line which has been released from resetting after precharging the main bit line and the complementary main bit line to the first voltage and previously resetting the plurality of sub-bit lines and the plurality of complementary sub-bit lines to the second voltage, and selectively releasing the resetting of one of the plurality of sub-bit lines and one of the plurality of complementary sub-bit lines. As a result, the aforementioned objective is accomplished.

The control section may control the plurality of subarrays so as to maintain a reset state of at least one sub-bit line adjoining the sub-bit line to which the charge has been redistributed from the main bit line, and to maintain a reset state of at least one complementary sub-bit line adjoining the complementary sub-bit line to which the charge has been redistributed from the complementary main bit line.

BRIEF DESCRIPTION OF THE DRAWINGS

FIG. 3 is a diagram schematically illustrating an operation of the semiconductor memory device 100.

FIG. 4 is a diagram schematically illustrating an operation of a conventional semiconductor memory device.

FIG. 6 is a timing chart illustrating an operation of the semiconductor memory device 200.

BEST MODES FOR CARRYING OUT THE INVENTION

Hereinafter, examples of the present invention will be described with reference to the figures.

Example 1

Figure 1:
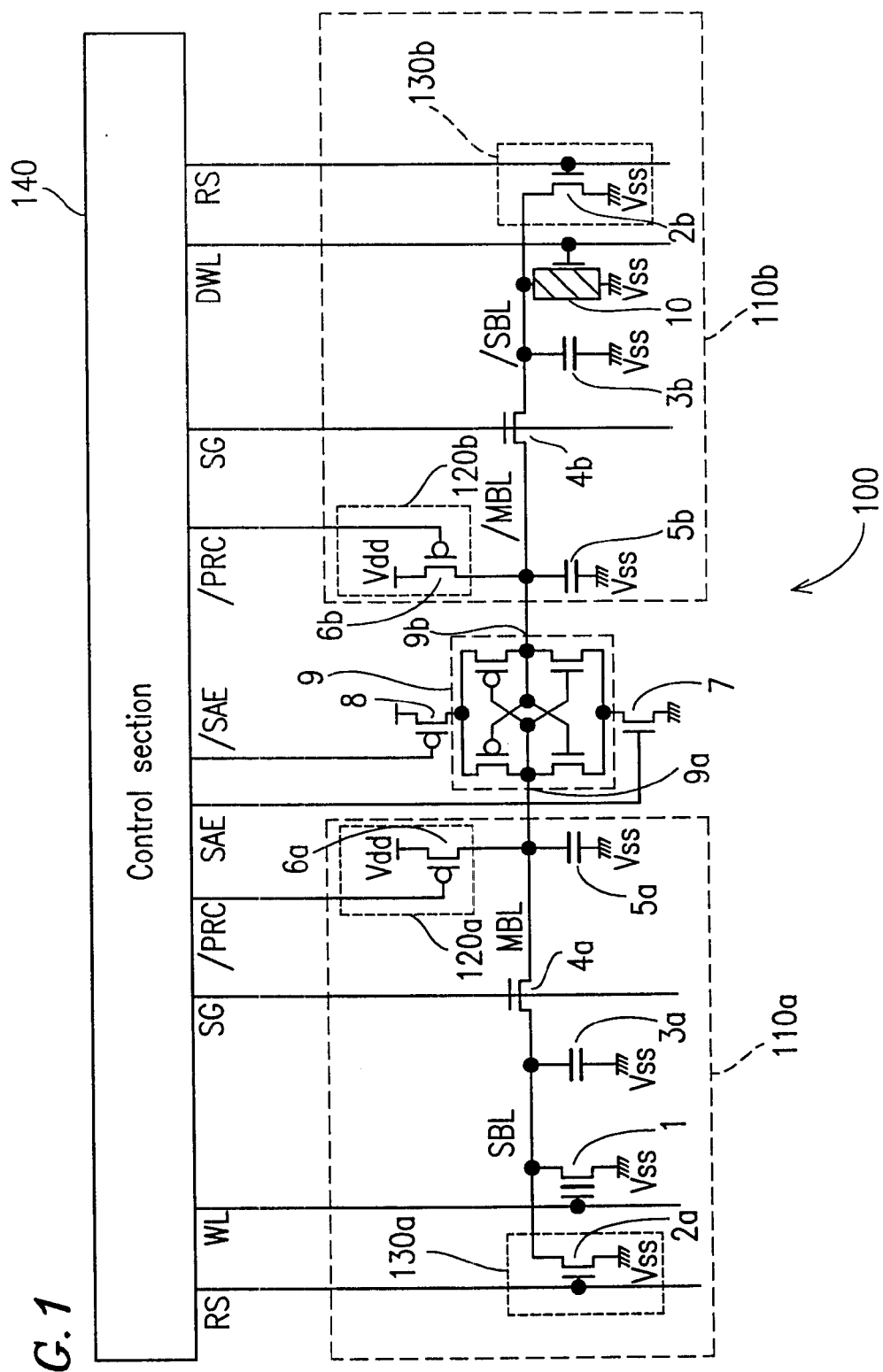
FIG. 1 is a diagram illustrating the structure of a semiconductor memory device 100 according to Example 1 of the present invention.

FIG. 1 illustrates the structure of a semiconductor memory device 100 according to Example 1 of the present invention. The semiconductor memory device 100 may be, for example, a non-volatile semiconductor memory device.

The semiconductor memory device 100 includes a differential sense amplifier 9 having a first input node in the form of an input node 9a and a second input node in the form of an input node 9b. The differential sense amplifier 9 determines the value of information which is read from a memory cell 1 by sensing a difference between the voltage on the input node 9a and the voltage on the input node 9b. For example, the differential sense amplifier 9 determines that the value of the information which is read from the memory cell 1 is "1" if the difference between the voltage on the input node 9a and the voltage on the input node 9b is greater than a predetermined threshold voltage, and otherwise determines that the value of the information which is read from the memory cell 1 is "0".

The semiconductor memory device 100 includes: an information read section 110a for supplying a voltage which varies in accordance with the information which is read from the memory cell 1 to the input node 9a; a reference section 110b for supplying a reference voltage to the input node 9b; and a control section 140 for controlling the differential sense amplifier 9, the information read section 110a, and the reference section 110b.

The information read section 110a includes: a main bit line MBL which is coupled to the input node 9a; a sub-bit line SBL which is coupled to the main bit line MBL via a select gate 4a; a memory cell 1 which is coupled to the sub-bit line SBL and which is selectively activated in accordance with a voltage on a word line WL: a precharge section 120a for precharging the input node 9a and the main bit line MBL to a supply voltage $V_{dd}$ which defines a first voltage; and a reset section 130a for resetting the sub-bit line SBL to a ground voltage $V_{ss}$ which defines a second voltage.

The select gate 4a is turned on when a select gate signal SG is at a high level, and turned off when the select gate signal SG is at a low level. The select gate signal SG is supplied from the control section 140 to the select gate 4a.

The precharge section 120a includes a Pch transistor 6a. One terminal of the Pch transistor 6a is coupled to a supply voltage $V_{dd}$. Another terminal of the Pch transistor 6a is coupled to the main bit line MBL. The Pch transistor 6a is turned off when a precharge signal /PRC is at a high level, and turned on when the precharge signal /PRC is at a low level. As a result, the input node 9a and the main bit line MBL are precharged to the supply voltage $V_{dd}$ when the precharge signal /PRC is at the low level. The precharge signal /PRC is supplied from the control section 140 to the precharge section 120a.

The reset section 130a includes an Nch transistor 2a. One terminal of the Nch transistor 2a is coupled to a sub-bit line SBL, and another terminal of the Nch transistor 2a is coupled to the ground voltage $V_{ss}$. The Nch transistor 2a is turned on when a reset signal RS is at a high level, and turned off when the reset signal RS is at a low level. As a result, the sub-bit line SBL is reset to the ground voltage $V_{ss}$ when the reset signal RS is at the high level. The reset signal RS is supplied from the control section 140 to the reset section 130a.

A capacitance 5a is coupled to the main bit line MBL. Herein, it is assumed that the capacitance 5a includes the stray capacitance of the main bit line MBL itself. A capacitance 3a is coupled to the sub-bit line SBL. Herein, it is assumed that the capacitance 3a includes the stray capacitance of the sub-bit line SBL itself.

The reference section 110b includes: a complementary main bit line /MBL which is coupled to the input node 9b; a complementary sub-bit line /SBL which is coupled to the complementary main bit line /MBL via a select gate 4b; a reference cell 10 which is coupled to the complementary sub-bit line /SBL and which is selectively activated in accordance with a voltage on the reference word line DWL; a precharge section 120b for precharging the input node 9b and the complementary main bit line /MBL to the supply voltage $V_{dd}$ which defines the first voltage: and a reset section 130b for resetting the complementary sub-bit line /SBL to the ground voltage $V_{ss}$ which defines the second voltage. Herein, the ground voltage $V_{ss}$ is lower than the supply voltage $V_{dd}$.

The structure of the select gate 4b, the precharge section 120b, and the reset section 130b is the same as the structure of the select gate 4a, the precharge section 120a, and the reset section 130a.

The current performance of the reference cell 10 is adjusted so as to be substantially half of the current performance of the memory cell 1. For example, the reference cell 10 may be a memory cell which includes a floating gate containing no electrons and whose channel width is substantially ½ that of the memory cell 1.

Instead of employing the reference cell 10, the precharge section 120b may be arranged so as to precharge the input node 9b and the complementary main bit line /MBL to a voltage obtained by multiplying the supply voltage $V_{dd}$ by a predetermined ratio α (where 0<α<1). By means of such a structure, the precharge section 120b can also supply a reference voltage to the input node 9b.

A capacitance 5b is coupled to the complementary main bit line /MBL. Herein, it is assumed that the capacitance 5b includes the stray capacitance of the complementary main bit line /MBL itself. A capacitance 3b is coupled to the complementary sub-bit line /SBL. Herein, it is assumed that the capacitance 3b includes the stray capacitance of the complementary sub-bit line /SBL itself.

Figure 2:
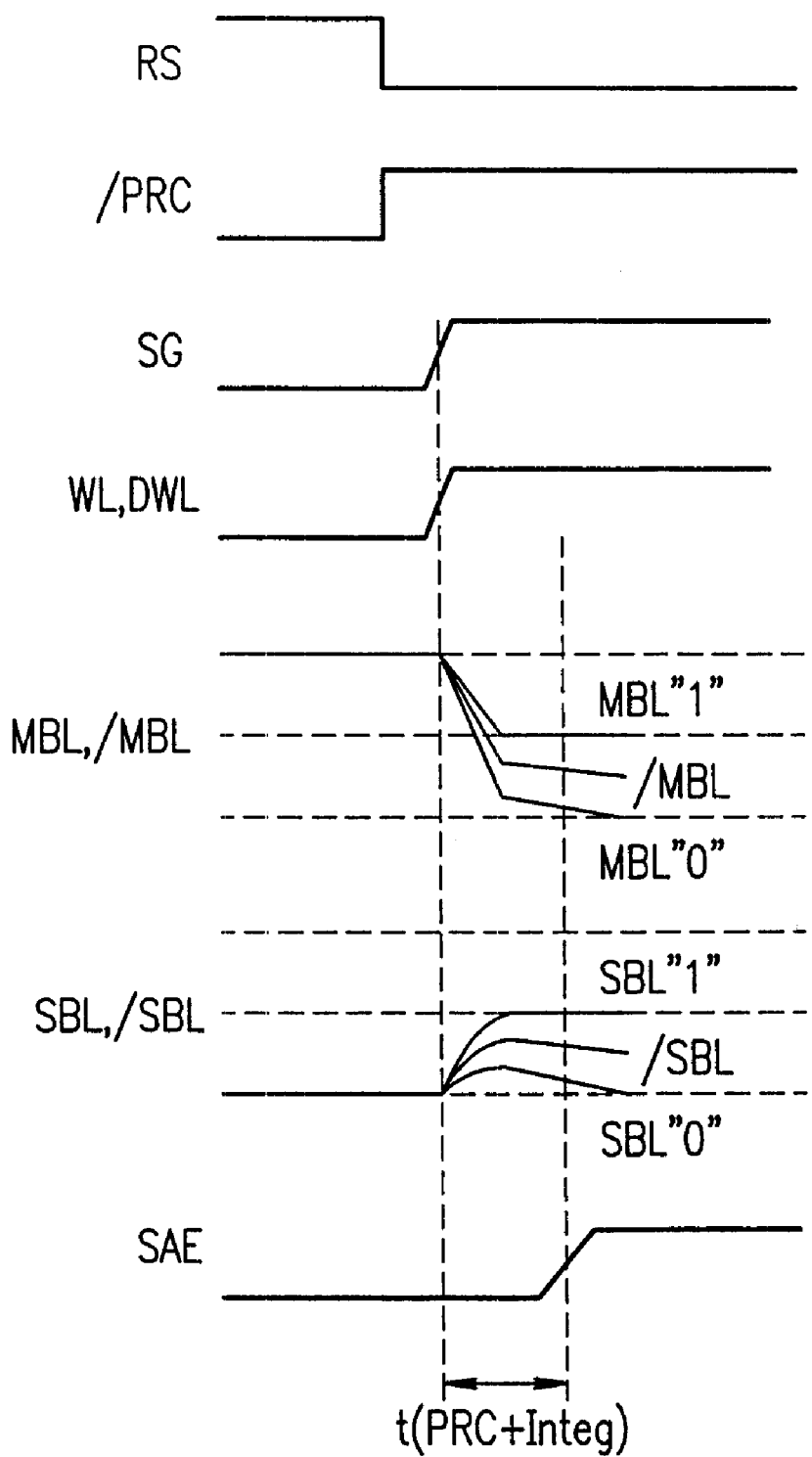
FIG. 2 is a timing chart illustrating an operation of the semiconductor memory device 100.

FIG. 2 illustrates an operation of the semiconductor memory device 100.

In an initial state, the reset signal RS is at a high level; the precharge signal /PRC is at a low level; the select gate signal SG is at a low level; and the word line WL and the reference word line DWL are at a low level.

As a result, in the information read section 110a, the input node 9a and the main bit line MBL are precharged to the supply voltage $V_{dd}$, and the sub-bit line SBL is reset to the ground voltage $V_{ss}$. Similarly, in the reference section 110b, the input node 9b and the complementary main bit line /MBL are precharged to the supply voltage $V_{dd}$, and the complementary sub-bit line /SBL is reset to the ground voltage $V_{ss}$.

Next, the reset signal RS shifts from the high level to a low level, and the precharge signal /PRC shifts from the low level to a high level. Furthermore, the select gate signal SG, the word line WL, and the reference word line DWL, as selected in accordance with an input address signal (not shown), are activated. In this example, it is assumed that the select gate signal SG, the word line WL, and the reference word line DWL, shown in FIG. 1 are selected in accordance with the address signal. As shown in FIG. 2, the select gate signal SG, the word line WL, and the reference word line DWL all shift from the respective low levels to the respective high levels.

Hereinafter, the operation of the semiconductor memory device 100 in the case where the value of the information stored in the memory cell 1 is "1" will be described. Herein, the state in which there is no current flowing in the memory cell 1 is defined as "1".

In the case where the value of the information stored in the memory cell 1 is "1", no current flows in the memory cell 1. If the select gate 4a is activated, the main bit line MBL and the sub-bit line SBL are electrically coupled to each other. As a result, a portion of the charge which is charged in the capacitance 5a coupled to the main bit line MBL migrates, via the select gate 4a, to the capacitance 3a, which is coupled to the sub-bit line SBL (charge redistribution). As a result, the voltage on the sub-bit line SBL gradually increases.

The voltage $V_{SBL}$ on the sub-bit line SBL after the charge redistribution can be calculated according to eq. 1:

$$V_{SBL}=\{C_m/(C_s+C_m)\}\cdot V_{dd} \qquad \text{eq. 1}$$

Herein, $C_m$ represents the capacitance value of the capacitance 5a; and $C_s$ represents the capacitance value of the capacitance 3a.

The voltage $V_{SBL}$ is equal to the voltage obtained by subjecting the supply voltage $V_{dd}$ to a capacitive division in accordance with capacitance values $C_m$ and $C_s$. The time required for the voltage on the sub-bit line SBL to be stabilized to the voltage $V_{SBL}$ is determined based on a time constant which is based on a series capacitance of the capacitances 5a and 3a as well as the impedance of the select gate 4a.

It is preferable that the voltage $V_{SBL}$ on the sub-bit line SBL after the charge redistribution is equal to or less than about 1 V because a read disturbance must be avoided in the case of a common NOR-type flash memory or the like, although this is not true where there is no read disturbance.

Herein, assuming that the voltage $V_{SBL}$ is about 1 V; the high level of the select gate 4a is equal to or greater than about 2.5 V; and the threshold voltage of the select gate 4a is about 0.5 V, the charge which has been charged in the capacitance 5a can pass sufficiently through the select gate 4a. As a result, the charge which has been charged in the capacitance 5a is completely redistributed between the capacitance 5a and the capacitance 3a.

As seen from eq. 1, the value of the voltage $V_{SBL}$ can be easily adjusted by adjusting the ratio between the capacitance values $C_m$ and $C_s$. Alternatively, the value of the voltage $V_{SBL}$ may be adjusted by varying the level of the supply voltage $V_{dd}$.

Referring to FIG. 2, the transition of the voltage on the main bit line MBL in the case where the value of the information stored in the memory cell 1 is "1" is illustrated as MBL "1". The transition of the voltage on the sub-bit line SBL in the case where the value of the information stored in the memory cell 1 is "1" is illustrated as SBL "1".

Hereinafter, the operation of the semiconductor memory device 100 in the case where the value of the information stored in the memory cell 1 is "0" will be described.

In the case where the value of the information stored in the memory cell 1 is "0", a current flows from the memory cell 1 to the ground voltage $V_{dd}$ when the memory cell 1 is activated. Since the select gate 4a and the word line WL are activated substantially simultaneously, the charge which has been charged in the capacitance 3a is discharged through the memory cell 1, concurrently with the aforementioned charge redistribution. Accordingly, the voltage which is reached by the voltage on the sub-bit line SBL after the charge redistribution is lower than the voltage $V_{SBL}$ which is obtained in accordance with eq. 1. As a result, the voltage which is reached by the voltage on the main bit line MBL after the charge redistribution is also lower than that in the case where the value of the information stored in the memory cell 1 is "1".

Referring to FIG. 2, the transition of the voltage on the main bit line MBL in the case where the value of the information stored in the memory cell 1 is "0" is illustrated as MBL "0". The transition of the voltage on the sub-bit line SBL in the case where the value of the information stored in the memory cell 1 is "0" is illustrated as SBL "0".

The transition of the voltage on the complementary main bit line /MBL is intermediate between the transition of the voltage on the main bit line MBL in the case where the value of the information stored in the memory cell 1 is "1" and the transition of the voltage on the main bit line MBL in the case where the value of the information stored in the memory cell 1 is "0". This is because, as described above, the current performance of the reference cell 10 is previously adjusted so as to be substantially half of the current performance of the memory cell 1.

The differential sense amplifier 9 is activated in response to an enable signal SAE. The differential sense amplifier 9 outputs information which indicates whether the value of the information which has been read from the memory cell 1 is "1" or "0" when the difference between the voltage on the main bit line MBL and the voltage on the complementary main bit line /MBL becomes sufficiently large.

In the example shown in FIG. 1, the differential sense amplifier 9 is a CMOS latch type differential sense amplifier. A CMOS latch type differential sense amplifier can be suitably used as the differential sense amplifier 9 because it is capable of operating in a broad voltage range with a high speed, requires a small layout area, and has a high driving performance. However, the differential sense amplifier 9 is not limited to this type of differential sense amplifier, but may be any type of differential sense amplifier. For example, the differential sense amplifier 9 may be a differential sense amplifier of a current driving type.

FIG. 3 schematically illustrates the operation of the semiconductor memory device 100. In the following description, the operation of the information read section 110a will be described assuming that the value of the information stored in the memory cell 1 is "0". The operation of the reference section 110b is similar to the operation of the information read section 110a.

In FIG. 3, each tub represents an element in the information read section 100a. The size of each tub represents the capacitance value of each element. The water level in each tub represents the voltage of that element. In FIG. 3, PR represents a precharge source for supplying the supply voltage $V_{dd}$, and GND represents a ground source for supplying the ground voltage $V_{ss}$.

Herein, it is assumed that the capacitance values of the precharge source PR and the ground source GND are infinite, and that the capacitance values of the input node 9a, the main bit line MBL, and the sub-bit line SBL are finite.

The capacitance value $C_m$ in eq. 1 corresponds to a sum of the capacitance value of the input node 9a and the capacitance value of the main bit line MBL.

The input node 9a and the main bit line MBL are coupled to the precharge source PR via a precharge gate. The precharge gate corresponds to the Pch transistor 6a shown in FIG. 1.

The sub-bit line SBL is coupled to the main bit line MBL via an SG gate. The SG gate corresponds to the select gate 4a shown in FIG. 1.

The sub-bit line SBL is coupled to the ground source GND via an SBL reset gate. The SBL reset gate corresponds to the Nch transistor 2a shown in FIG. 1.

A WL gate is coupled to the sub-bit line SBL. The WL gate corresponds to the memory cell 1 shown in FIG. 1. In other words, the WL gate is "open" when the value of the information stored in the memory cell 1 is "0" and the memory cell 1 is activated; otherwise, the WL gate is "closed".

① Initial State

The precharge gate and the SBL reset gate become "open", whereas the SG gate and the WL gate become "closed". As a result, the input node 9a and the main bit line MBL are precharged by the precharge source PR, and the sub-bit line SBL is reset by the ground source GND.

② Charge Redistribution and Start of Integration Period

The precharge gate and the SBL reset gate become "closed", and the SG gate and the WL gate, as selected in accordance with an input address signal, become "open". As a result, a portion of the charge which is precharged in the input node 9a and the main bit line MBL migrates, via the SG gate, to the sub-bit line SBL (charge redistribution). The sub-bit line SBL is charged as a result of the charge redistribution. Concurrently with the charging of the sub-bit line SBL, a current flows out from the WL gate. Thus, a sense integration can be begun before the charging of the sub-bit line SBL is completed. Since the current flowing out from the WL gate is sufficiently small as compared with the current flowing from the main bit line MBL to the sub-bit line SBL, the voltage on the sub-bit line SBL quickly increases.

③ Integration Period

Following the start of an integration period ②, the integration period continues. The voltage on the main bit line MBL gradually decreases while charge redistribution occurs and as a current flows out from the WL gate. When the voltage on the main bit line MBL has gone below a predetermined level, the differential sense amplifier 9 outputs information indicating the value of the information which has been read from the memory cell 1.

The operation of the semiconductor memory device 100 in the case where the value of the information which is stored in the memory cell 1 is "1" is identical with the operation illustrated in FIG. 3 except that no current flows in the memory cell 1 (i.e., the WL gate of the memory cell 1 becomes "closed") during the start of the integration period ② and the integration period ③. Therefore, the description thereof is omitted.

Thus, in accordance with the semiconductor memory device 100, the sub-bit line SBL is precharged by utilizing charge redistribution. In the case where the value of the information stored in the memory cell 1 is "0", a current flows from the memory cell 1 to the ground voltage $V_{ss}$. As a result, the sub-bit line SBL is discharged. Such a discharging of the sub-bit line SBL occurs concurrently with the precharging of the sub-bit line SBL, without waiting for the charge redistribution to finish. As a result, the time required for the precharging of the sub-bit line SBL and the integration of the charge which has been released from the memory cell 1 can be reduced.

Furthermore, the time required for the charge redistribution can be reduced to an almost negligible level because it is easy to design the time constant based on the impedance of the select gate 4a and the capacitances 5a and 3a so as to be sufficiently small. For example, by securing a sufficiently high current driving performance in the transistor used for the select gate 4a, it is possible to design the time constant so as to be sufficiently small. This substantially contributes to the enhancement of the read rate of information from the memory cell 1.

Furthermore, the precharging of the main bit line MBL can occur before ascertaining an address. By previously performing a precharge of the main bit line MBL during a period preceding the address ascertainment, the reading of information from the memory cell 1 can be made faster. For example, the precharging of the main bit line NBL may be performed during a period from the completion of the sense operation by the differential sense amplifier 9 until the receipt of a next address. As a result, it is possible to assume that there is apparently no precharge period for precharging the main bit line MBL.

Thus, according to the present invention, a semiconductor memory device 100 can be provided which is capable of reading information from the memory cell 1 with a high speed.

FIG. 4 schematically illustrates the operation of a conventional semiconductor memory device described in the aforementioned publication, for comparison with FIG. 3. In the following description, it is assumed that the value of the information stored in the memory cell is "0".

In FIG. 4, each tub represents an element required for reading information from the memory cell. The size of each tub represents the capacitance value of each element. The water level in each tub represents the voltage of that element.

Herein, it is assumed that the capacitance values of the precharge source PR and the ground source GND are infinite, and that the capacitance values of one input node (hereinafter referred to as an input node P0) of the differential sense amplifier, the main bit line MBL, and the sub-bit line SBL are finite.

The input node P0 is coupled to the precharge source PR via a precharge gate. The main bit line MBL is coupled to the input node P0 via a Y gate. The sub-bit line SBL is coupled to the main bit line MBL via an SG gate. The sub-bit line SBL is coupled to the ground source GND via an SBL reset gate.

A WL gate is coupled to the sub-bit line SBL. The WL gate is "open" when the value of the information stored in the memory cell is "0" and the memory cell is activated; otherwise, the WL gate is "closed".

① Initial State

The SBL reset gate becomes "open", whereas the other gates become "closed". As a result, the input node P0, the main bit line MBL, and the sub-bit line SBL are reset by the ground source GND. Although the main bit line MBL also has an MBL reset gate, it is not shown.

② Start of Precharge

The precharge gate becomes "open", and the SBL reset gate becomes "closed". Moreover, the Y gate, the SG gate, and the WL gate, as selected in accordance with an input address signal, become "open". Herein, it is assumed that the Y gate, the SG gate, and the WL gate shown in FIG. 4 are selected. As a result, the input node P0, the main bit line MBL, and the sub-bit line SBL are precharged by the precharge source PR. The time constant at this time is determined based on the series capacitance of the series impedance of the precharge gate, the Y gate, and the SG gate, and the parallel capacitance of the main bit line MBL and the sub-bit line SBL. On the other hand, a current flows from the WL gate to the ground voltage $V_{ss}$. However, since the amount of current flowing out from the WL gate is small as compared with the amount of current flowing from the main bit line MBL into the sub-bit line SBL, the voltages on the input node PO, the main bit line MBL, and the sub-bit line SBL gradually increase.

③ Completion of precharge

The precharge is completed when the voltages on the input node P0, the main bit line MBL, and the sub-bit line SBL have increased to the voltage on the precharge source PR.

④ Start of Integration Period

The precharge gate becomes "closed". As a result, the precharge source PR is electrically isolated from the input node P0, the main bit line MBL, and the sub-bit line SBL. A sense integration can be started after the precharge gate has become "closed". Thus, an integration period starts at the time when the precharge gate has become "closed".

⑤ Integration Period Following the start of an integration period ④, the integration period continues. The voltages on the input node P0, the main bit line MBL, and the sub-bit line SBL gradually decrease as a current flows out from the WL gate. When the voltage on the main bit line MBL has gone below a predetermined level, the differential sense amplifier outputs information indicating the value of the information which has been read from the memory cell.

The operation of the conventional semiconductor memory device in the case where the value of the information which is stored in the memory cell 1 is "1" is identical with the operation illustrated in FIG. 4 except that no current flows in the memory cell (i.e., the WL gate of the memory cell becomes "closed") during the periods ② to ⑤. Therefore, the description thereof is omitted.

Thus, in accordance with the conventional semiconductor memory device, a precharge operation is started after the ascertainment of an address, and an integration operation is started after the completion of the precharge operation. Therefore, the time required for reading information from the memory cell is equal to a sum of a precharge time (tPRC) and an integration time (tInteg) (i.e., tPRC+tInteg).

On the other hand, in accordance with the semiconductor memory device 100 of the present invention, a sense integration occurs concurrently with the charging of the sub-bit line SBL. Therefore, the time required for reading information from the memory cell 1 is equal to t (PRC+Integ) (see FIG. 2). Herein, t(PRC+Integ)<tPRC+tInteg.

Although Example 1 illustrates an example in which the present invention is applied to a semiconductor memory device based on an open bit line method, the applications of the present invention are not limited thereto. For example, the present invention can be applied to a semiconductor memory device based on a folded bit line method.

Example 2

Figure 5:
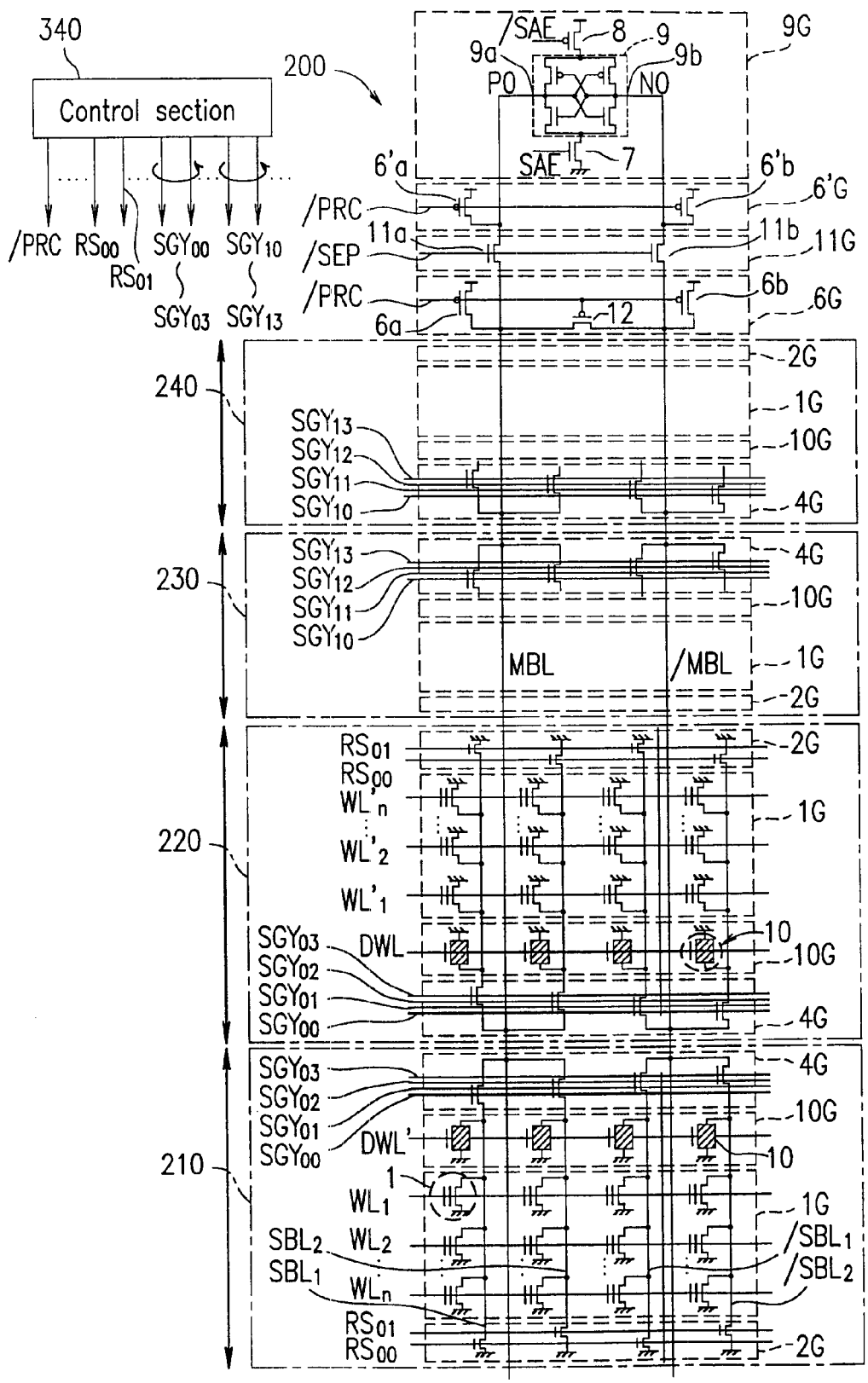
FIG. 5 is a diagram illustrating the structure of a semiconductor memory device 200 according to Example 2 of the present invention.

FIG. 5 illustrates the structure of a semiconductor memory device 200 according to Example 2 of the present invention. The semiconductor memory device 200 may be, for example, a non-volatile semiconductor memory device.

The semiconductor memory device 200 includes a differential sense amplifier 9 having a first input node 9a (P0) and a second input node 9b (NO). A main bit line MBL is coupled to the input node 9a via a main bit line isolation gate 11a. A complementary main bit line /MBL is coupled to the input node 9b via a main bit line isolation gate 11b.

The semiconductor memory device 200 further includes a precharge section 6'G for precharging the input nodes 9a and 9b to a supply voltage $V_{dd}$, and a precharge section 6G for precharging the main bit line MBL and the complementary main bit line /MBL to the supply voltage $V_{dd}$. The precharge section 6'G includes Pch transistors 6'a and 6'b which are turned on or off in accordance with a precharge signal /PRC. The precharge section 6G includes Pch transistors 6a and 6b which are turned on or off in accordance with the precharge signal /PRC, and an equalizing transistor 12.

The semiconductor memory device 200 further includes a plurality of subarrays 210 to 240 which are arranged in a direction along which the main bit line MBL and the complementary main bit line /MBL extend. Each of the plurality of subarrays 210 to 240 is constructed so as to include the information read section 110a and the reference section 110b as shown in FIG. 1, the information read section 110a and the reference section 110b being used in common.

The semiconductor memory device 200 further includes a control section 340 for controlling the differential sense amplifier 9, the precharge sections 6'G and 6G and the plurality of subarrays 210 to 240. The control section 340 outputs signals shown in FIG. 5, e.g., the precharge signal /PRC, reset signals $RS_{00}$ and $RS_{01}$, and select gate signals $SGY_{00}$ to $SGY_{03}$ and $SGY_{10}$ to $SGY_{13}$.

The subarray 210 includes: a memory cell array 1G including a plurality of memory cells 1; a reference cell array 10G including a plurality of reference cells 10; a select gate section 4G for selectively coupling the main bit line MBL to one of a plurality of sub-bit lines $SBL_1$ to $SBL_2$ and for selectively coupling the complementary main bit line /MBL to one of a plurality of complementary sub-bit lines $/SBL_1$ to $/SBL_2$; and a reset gate section 2G for previously resetting the sub-bit lines $SBL_1$ to $SBL_2$ and the complementary sub-bit lines $/SBL_1$ to $/SBL_2$ to the voltage $V_{ss}$ and for selectively releasing the resetting of one of the sub-bit lines $SBL_1$ to $SBL_2$ and one of the complementary sub-bit lines $/SBL_1$ to $/SBL_2$.

The subarray 220 has a similar structure to that of the subarray 210. However, each of the plurality of memory cells 1 included in the subarray 210 is selectively activated by a voltage on a corresponding word line among word lines $WL_1$ to $WL_n$, whereas each of the plurality of memory cells 1 included in the subarray 220 is selectively activated by a voltage on a corresponding word line among word lines $WL'_1$ to $WL'_n$. Each of the plurality of reference cells 10 included in the subarray 210 is selectively activated by a voltage on a reference word line DWL', whereas each of the plurality of reference cells 10 included in the subarray 220 is selectively activated by a voltage on a reference word line DWL.

In the case where one of the plurality of memory cells 1 in the subarray 210 is selected, one of the plurality of reference cells 10 in the subarray 220 is selected. On the other hand, in the case where one of the plurality of memory cells 1 in the subarray 220 is selected, one of the plurality of reference cells 10 in the subarray 210 is selected. Thus, the subarray 210 and the subarray 220 operate in a complementary manner to each other. That is, although the input node 9a of the differential sense amplifier is coupled to the main bit line MBL, and the input node 9b of the differential sense amplifier is coupled to the complementary main bit line /MBL in the semiconductor memory device 200 shown in FIG. 5, it is possible, depending on each particular selected memory cell and selected reference cell, that the line coupled to the input node 9a of the differential sense amplifier may become the complementary main bit line /MBL, and the line coupled to the input node 9b of the differential sense amplifier may become the main bit line MBL.

The structure of the subarrays 230 and 240 is similar to that of the subarrays 210 and 220. However, a summarized illustration of the structure of the subarrays 230 and 240 is presented for conciseness. The subarrays 230 and 240 also operate in a complementary manner to each other, like the subarrays 210 and 220.

To each of the sub-bit lines $SBL_1$ and $SBL_2$, at least one of the plurality of memory cells 1 included in the memory cell array 1G and at least one of the plurality of reference cells 10 included in the reference cell array 10G are coupled. To each of the complementary sub-bit lines $/SBL_1$ and $/SBL_2$, at least one of the plurality of memory cells 1 included in the memory cell array 1G and at least one of the plurality of reference cells 10 included in the reference cell array 10G are coupled.

The control section 340 controls the precharge section 6G and the plurality of subarrays 210 to 240 so that a portion of the charge which is precharged in the main bit line MBL is redistributed to the sub-bit line which has been selectively released from resetting, and that a portion of the charge which is precharged in the complementary main bit line /MBL is redistributed to the complementary sub-bit line which has been selectively released from resetting after precharging the main bit line MBL and the complementary main bit line /MBL to the supply voltage $V_{dd}$ and previously resetting the sub-bit lines $SBL_1$ to $SBL_2$ and the complementary sub-bit lines $/SBL_1$ to $/SBL_2$ to the voltage $V_{ss}$, and selectively releasing the resetting of one of the sub-bit lines $SBL_1$ to $SBL_2$ and one of the complementary sub-bit lines $/SBL_1$ to $/SBL_2$.

Although the number of subarrays in the example illustrated in FIG. 5 is four, the number of subarrays is not limited to four. The semiconductor memory device 200 may include any number of subarrays. Although the number of sub-bit lines and the complementary sub-bit lines included in one subarray in the example illustrated in FIG. 5 is two, this number is not limited to two. The semiconductor memory device 200 may include any number of sub-bit lines and complementary sub-bit lines.

When a semiconductor memory device 200 having the aforementioned subarray structure is implemented on an actual semiconductor integrated circuit, the main bit line MBL, the sub-bit lines $SBL_1$ to $SBL_2$, the complementary main bit line /MBL, and the complementary sub-bit lines /$SBL_1$ to /$SBL_2$ will each have a stray capacitance. By placing the main bit line MBL and the complementary main bit line /MBL in a symmetrical layout, it is possible to substantially equalize the capacitance value $C_m$ of the main bit line MBL with the capacitance value $C_m'$ of the complementary main bit line /MBL in spite of mask misalignment or process variations (e.g., variations in the thickness of interlayer films). Similarly, by placing the sub-bit lines $SBL_1$ to $SBL_2$ and the complementary sub-bit lines /$SBL_1$ to /$SBL_2$ in a symmetrical layout, it is possible to substantially equalize the capacitance value $C_s$ of the sub-bit lines $SBL_1$ to $SBL_2$ with the capacitance value $C_s'$ of the complementary sub-bit lines /$SBL_1$ to /$SBL_2$ in spite of mask misalignment or process variations (e.g., variations in the thickness of interlayer films).

Moreover, by performing a three-dimensional capacitance extraction, it is possible to accurately estimate the capacitance values $C_m$ and $C_s$ when designing a layout. Therefore, by coupling a capacitor to the main bit line MBL or the sub-bit line SBL, if necessary, it is possible to adjust the capacitance values $C_m$ and $C_s$ to appropriate values. Herein, the capacitance value $C_m$ is to be designed as a value including the capacitance value from the sense amplifier isolation transistor 11a to the input node 9a.

FIG. 6 illustrates an operation of the semiconductor memory device 200.

In an initial state, the input nodes 9a and 9b, the main bit line MBL, and the complementary main bit line /MBL are precharged to the supply voltage $V_{dd}$. On the other hand, the sub-bit line $SBL_1$ to $SBL_2$ and the complementary sub-bit line /$SBL_1$ to /$SBL_2$ are reset to the ground voltage $V_{ss}$.

In response to a falling edge of a chip enable signal /CE, the precharge signal /PRC is inactivated. As a result, the precharging of the input nodes 9a and 9b, the main bit line MBL, and the complementary main bit line /MBL is completed.

In response to an address signal ADD, two of the subarrays 210 to 240 are selected that are of a complementary relationship with each other. Herein, it is assumed that the subarrays 210 and 220 have been selected. Furthermore, it is assumed that the select gate signal $SGY_{00}$, the word line $WL_1$, and the reference word line DWL have been selected in response to the address signal ADD, and that the SBL reset signal $RS_{00}$ has shifted from a high level to a low level. The SBL reset signal $RS_{01}$ remains at a high level. In this case, the memory cell 1 and the reference cell 10 which are circled by broke lines in FIG. 5 are selected.

The transitions of the voltages on the main bit line MBL and the sub-bit line $SBL_1$ corresponding to the selected memory cell are as shown in FIG. 6.

Referring to FIG. 6, the transition of the voltage on the main bit line MBL in the case where the value of the information stored in the memory cell 1 is "0" is illustrated as MBL "0". The transition of the voltage on the sub-bit line $SBL_1$ in the case where the value of the information stored in the memory cell 1 is "0" is illustrated as SBL "0". The transition of the voltage on the main bit line MBL in the case where the value of the information stored in the memory cell 1 is "1" is illustrated as MBL "1". The transition of the voltage on the sub-bit line $SBL_1$ in the case where the value of the information stored in the memory cell 1 is "1" is illustrated as SBL "1".

The transitions of the voltages on the complementary main bit line /MBL and the complementary sub-bit line /$SBL_1$ corresponding to the selected reference cell 10 are as shown in FIG. 6.

Referring to FIG. 6, the transition of the voltage on the complementary main bit line /MBL is illustrated as /MBL. The transition of the voltage on the complementary sub-bit line /$SBL_1$ is illustrated as /SBL.

Similar effects to those obtained with the semiconductor memory device 100 according to Example 1 can also be obtained with the semiconductor memory device 200.

According to Example 2, since the SBL reset signal shifts from a high level to a low level, even when the reset state of the selected sub-bit line (e.g., the sub-bit line $SBL_1$) is released, the reset state of the sub-bit line (e.g., the sub-bit line $SBL_2$) adjoining that sub-bit line will not be released. Thus, by maintaining the reset state of the sub-bit line adjoining a sub-bit line to which charge from the main bit line has been redistributed, influence from the storage content in a memory cell 1 coupled to the adjoining sub-bit line can be avoided. Similarly, by maintaining the reset state of the complementary sub-bit line adjoining a complementary sub-bit line to which charge from the complementary main bit line has been redistributed, influence from the storage content in a memory cell 1 coupled to the adjoining complementary sub-bit line can be avoided.

The number of sub-bit lines which adjoin a selected sub-bit line and which are not released from resetting even when the reset state of the selected sub-bit line is released is not limited to one. The number of sub-bit lines which adjoin such a selected sub-bit line and which are not released from resetting may be any integer equal to or greater than two.

Similarly, the number of complementary sub-bit lines which adjoin a selected complementary sub-bit line and which are not released from resetting even when the reset state of the selected complementary sub-bit line is released is not limited to one. The number of complementary sub-bit lines which adjoin such a selected complementary sub-bit line and which are not released from resetting may be any integer equal to or greater than two.

For example, although only one set of sense systems is shown in FIG. 5, a plurality of sets of sense systems may be provided, in which case the reset state of the two sub-bit lines adjoining a selected sub-bit line on both sides will be maintained, and the reset state of the two complementary sub-bit lines adjoining a selected complementary sub-bit line on both sides will be maintained.

In all of the above-described examples, the memory cell 1 may be any type of memory cell. For example, the memory cell 1 may be a NOR type 1TR flash cell, or a Split type flash cell. The present invention is also applicable to another type of non-volatile memory such as a mask ROM. As a result, a non-volatile memory which is capable of reading information from a memory cell with a high speed can be obtained.

In all of the above-described examples, the reference cells are provided so as to be associated with the sub-bit lines (or the complementary sub-bit lines). However, the present invention is not limited to such an arrangement. The reference cells may be provided so as to be associated with the main bit line (or the complementary main bit line). It will be appreciated that similar effects to those described above can be obtained with such an arrangement as well.

Furthermore, the main bit line or sub-bit line to which a memory cell is coupled may be coupled to a reference cell which is able to flow a current which is about ½ the current flowing in that memory cell. It will be appreciated that similar effects to those described above can be obtained with such an arrangement as well.

INDUSTRIAL APPLICABILITY

In accordance with the semiconductor memory device according to the present invention, a portion of the charge which is precharged in a first input node and a main bit line is redistributed to a sub-bit line after precharging the first input node and the main bit line to a first voltage and resetting the sub-bit line to a second voltage. As a result, a semiconductor memory device which is capable of reading information from a memory cell with a high speed can be provided.

What is claimed is:

1. A semiconductor memory device comprising:
   a differential sense amplifier having a first input node and a second input node for sensing a difference between a voltage on the first input node and a voltage on the second input node:
   an information read section for supplying a voltage varying in accordance with information which is read from a memory cell, the voltage being supplied to the first input node;
   a reference section for supplying a reference voltage to the second input node: and
   a control section for controlling the differential sense amplifier, the information read section, and the reference section,
   wherein
      the information read section includes:
      a main bit line coupled to the first input node;
      a select gate:
      a sub-bit line which is coupled to the main bit line via the select gate;
      a memory cell which is coupled to the sub-bit line and which is selectively activated in accordance with a voltage on a word line;
      a precharge section for precharging the first input node and the main bit line to a first voltage; and
      a reset section for resetting the sub-bit line to a second voltage which is lower than the first voltage,
      wherein the control section controls the precharge section, the reset section, and the select gate so that a portion of a charge which is precharged in the first input node and the main bit line is redistributed to the sub-bit line after precharging the first input node and the main bit line to the first voltage and resetting the sub-bit line to the second voltage.

2. A semiconductor memory device according to claim 1, wherein the information read section further comprises:
   a first capacitance coupled to the main bit line; and
   a second capacitance coupled to the sub-bit line.

3. A semiconductor memory device according to claim 1, wherein a voltage on the sub-bit line after the charge which is precharged in the first input node and the main bit line is redistributed is equal to or less than about 1 V.

4. A semiconductor memory device according to claim 1, wherein the reference section comprises:
   a complementary main bit line coupled to the second input node; and
   a precharge section for precharging the second input node and the complementary main bit line to a third voltage,
      wherein the third voltage is equal to a voltage which is obtained by multiplying the first voltage by a predetermined ratio.

5. A semiconductor memory device according to claim 1, wherein the reference section outputs the reference voltage by using a reference cell having a current performance which is substantially half of a current performance of the memory cell.

6. A semiconductor memory device according to claim 1, wherein the differential sense amplifier senses the difference between the voltage on the first input node and the voltage on the second input node through sense integration.

7. A semiconductor memory device according to claim 6, wherein the sense integration is begun while a portion of a charge which is precharged in the first input node and the main bit line is redistributed to the sub-bit line.

8. A semiconductor memory device comprising:
   a differential sense amplifier having a first input node and a second input node for sensing a difference between a voltage on the first input node and a voltage on the second input node;
   a main bit line coupled to the first input node;
   a complementary main bit line coupled to the second input node;
   a precharge section for precharging the main bit line and the complementary main bit line to a first voltage;
   a plurality of subarrays arranged in a direction along which the main bit line and the complementary main bit line extend; and
   a control section for controlling the differential sense amplifier, the precharge section, and the plurality of subarrays,
   wherein each of the plurality of subarrays includes:
      a select gate section for selectively coupling the main bit line to one of a plurality of sub-bit lines and selectively coupling the complementary main bit line to one of a plurality of complementary sub-bit lines;
      a reset section for resetting the plurality of sub-bit lines to a second voltage which is lower than the first voltage, selectively releasing the resetting of one of the plurality of sub-bit lines, resetting the plurality of complementary sub-bit lines to the second voltage, and selectively releasing the resetting of one of the plurality of complementary sub-bit lines;
      a memory cell array including a plurality of memory cells; and
      a reference cell array including a plurality of reference cells,
      wherein:
         each of the plurality of memory cells is selectively activated in accordance with a voltage on a corresponding one of a plurality of word lines, and each of the plurality of reference cells is selectively activated in accordance with a voltage on a reference word line;
         at least one of the plurality of memory cells and at least one of the plurality of reference cells are coupled to each of the plurality of sub-bit lines;
         at least one of the plurality of memory cells and at least one of the plurality of reference cells are coupled to each of the plurality of complementary sub-bit lines: and
         the control section controls the precharge section and the plurality of subarrays so that a portion of a charge which is precharged in the main bit line is redistributed to the sub-bit line which has been released from resetting, and that a portion of a charge which is precharged in the complementary main bit line is redistributed to the complementary sub-bit line which has been released from resetting after precharging the main bit line and the complementary main bit line to the first voltage and previously resetting the plurality of sub-bit lines and the plurality of complementary sub-bit lines to the second voltage, and selectively releasing the resetting of one of the plurality of sub-bit lines and one of the plurality of complementary sub-bit lines.

9. A semiconductor memory device according to claim 8, wherein the control section controls the plurality of subarrays so as to maintain a reset state of at least one sub-bit line adjoining the sub-bit line to which the charge has been redistributed from the main bit line, and to maintain a reset state of at least one complementary sub-bit line adjoining the complementary sub-bit line to which the charge has been redistributed from the complementary main bit line.

10. A semiconductor memory device comprising:
    a differential sense amplifier having a first input node and a second input node for sensing a difference between a voltage on the first input node and a voltage on the second input node;
    a main bit line coupled to the first input node;
    a complementary main bit line coupled to the second input node;
    a precharge section for precharging the main bit line and the complementary main bit line to a first voltage;
    a plurality of subarrays arranged in a direction along which the main bit line and the complementary main bit line extend; and
    a control section for controlling the differential sense amplifier, the precharge section, and the plurality of subarrays,
    wherein each of the plurality of subarrays includes:
        a select gate section for selectively coupling the main bit line to one of a plurality of sub-bit lines and selectively coupling the complementary main bit line to one of a plurality of complementary sub-bit lines;
        a reset section for resetting the plurality of sub-bit lines to a second voltage which is lower than the first voltage, selectively releasing the resetting of one of the plurality of sub-bit lines, resetting the plurality of complementary sub-bit lines to the second voltage, and selectively releasing the resetting of one of the plurality of complementary sub-bit lines; and
    a memory cell array including a plurality of memory cells,
    wherein:
        each of the plurality of memory cells is selectively activated in accordance with a voltage on a corresponding one of a plurality of word lines;
        at least one of the plurality of memory cells is coupled to each of the plurality of sub-bit lines;
        at least one of the plurality of memory cells is coupled to each of the plurality of complementary sub-bit lines; and
        the control section controls the precharge section and the plurality of subarrays so that a portion of a charge which is precharged in the main bit line is redistributed to the sub-bit line which has been released from resetting, and that a portion of a charge which is precharged in the complementary main bit line is redistributed to the complementary sub-bit line which has been released from resetting after precharging the main bit line and the complementary main bit line to the first voltage and previously resetting the plurality of sub-bit lines and the plurality of complementary sub-bit lines to the second voltage, and selectively releasing the resetting of one of the plurality of sub-bit lines and one of the plurality of complementary sub-bit lines.

11. A semiconductor memory device according to claim 10, wherein the control section controls the plurality of subarrays so as to maintain a reset state of at least one sub-bit line adjoining the sub-bit line to which the charge has been redistributed from the main bit line, and to maintain a reset state of at least one complementary sub-bit line adjoining the complementary sub-bit line to which the charge has been redistributed from the complementary main bit line.

* * * * *